(12) United States Patent
Yano et al.

(10) Patent No.: US 7,298,215 B2
(45) Date of Patent: Nov. 20, 2007

(54) AMPLIFYING CIRCUIT

(75) Inventors: Hitoshi Yano, Tokyo (JP); Tomoyuki Yamase, Tokyo (JP); Keiichi Numata, Tokyo (JP); Tadashi Maeda, Tokyo (JP)

(73) Assignee: NEC Corporation, Tokyo (JP)

( * ) Notice: Subject to any disclaimer, the term of this patent is extended or adjusted under 35 U.S.C. 154(b) by 173 days.

(21) Appl. No.: 10/537,470

(22) PCT Filed: Dec. 3, 2003

(86) PCT No.: PCT/JP03/15468

§ 371 (c)(1),
(2), (4) Date: Jun. 3, 2005

(87) PCT Pub. No.: WO2004/051845

PCT Pub. Date: Jun. 17, 2004

(65) Prior Publication Data

US 2006/0033573 A1  Feb. 16, 2006

(30) Foreign Application Priority Data

Dec. 4, 2002  (JP) .............................. 2002-352664

(51) Int. Cl.
*H03G 3/30* (2006.01)

(52) U.S. Cl. ...................................... 330/384; 330/302

(58) Field of Classification Search ................ 330/284, 330/124 R, 295
See application file for complete search history.

(56) References Cited

U.S. PATENT DOCUMENTS 5,862,461 A * 1/1999 Yoshizawa et al. ...... 455/127.3
6,114,911 A * 9/2000 Iwai et al. .................. 330/295

FOREIGN PATENT DOCUMENTS

| JP | 3-195108 A | 8/1991 |
|----|------------|--------|
| JP | 5-206818 | 8/1993 |
| JP | 5-299995 | 11/1993 |
| JP | 6-283938 A | 10/1994 |
| JP | 7-235802 A | 9/1995 |
| JP | 10-126164 A | 5/1998 |
| JP | 2000-307456 | 11/2000 |
| JP | 2000-332545 | 11/2000 |
| JP | 2000-349574 | 12/2000 |
| JP | 2000-349574 A | 12/2000 |
| JP | 2001-267865 A | 9/2001 |
| JP | 2001-345653 | 12/2001 |
| JP | 2002-135060 A | 5/2002 |
| JP | 2002-141752 A | 5/2002 |
| JP | 2002-185270 A | 6/2002 |
| JP | 2002-217657 A | 8/2002 |
| JP | 2002-271152 A | 9/2002 |

* cited by examiner

*Primary Examiner*—Robert Pascal
*Assistant Examiner*—Hieu Nguyen
(74) *Attorney, Agent, or Firm*—Sughrue Mion, PLLC

(57) ABSTRACT

The present invention provides an amplifying circuit capable of accomplishing high-impedance input/output, and providing a high gain and low power consumption. The amplifier amplifies a signal received through an input terminal, and outputs the signal through an output terminal. A control circuit comprised of the inductors, and the switches turns input/output impedances of the amplifier into a high impedance.

4 Claims, 12 Drawing Sheets

(a)

(b)

(a)

(b)

RELATED ART

AMPLIFYING CIRCUIT

CROSS-REFERENCE TO RELATED PATENT APPLICATIONS

The entire disclosure of Japanese Patent Application No. 2002-352664 filed on Dec. 4, 2002 including specification, claims, drawings and summary is incorporated herein by reference in its entirety.

FIELD OF THE INVENTION

The invention relates to an amplifying circuit for amplifying a high-frequency signal, and further to a gain-variable amplifying circuit including a plurality of the amplifying circuits.

PRIOR ART

A gain-variable amplifying circuit is an important circuit in a wireless communication system. With popularization of a mobile phone and an increase in a data transmission rate in a wireless LAN system for adaptation to a multi-media system, such a gain-variable amplifying circuit is now required to be able to operate with smaller power and control a gain more precisely.

FIG. 11 is a circuit diagram of an example of a conventional gain-variable amplifying circuit.

The gain-variable amplifying circuit illustrated in FIG. 11 is comprised of a variable attenuator 91, and an amplifier 92 electrically connected in series to the variable attenuator 91. The illustrated gain-variable amplifying circuit controls an amplification rate by varying attenuation of the variable attenuator 91.

FIG. 12 is a circuit diagram of another example of a conventional gain-variable amplifying circuit.

The gain-variable amplifying circuit illustrated in FIG. 12 is comprised of a variable attenuator 93, an amplifier 94 electrically connected in parallel to the variable attenuator 93, and switches $95_1$ and $95_2$ through which one of the variable attenuator 93 and the amplifier 94 is selected.

When the switches $95_1$ and $95_2$ are electrically connected to terminals associated with the amplifier 94, the amplifier 94 is selected (FIG. 12 illustrates a condition where the amplifier 94 is selected). In contrast, when the switches $95_1$ and $95_2$ are electrically connected to terminals associated with the variable attenuator 93, the variable attenuator 93 is selected FIG. 13 is a circuit diagram of still another example of a conventional gain-variable amplifying circuit, disclosed in Japanese Patent Application Publication No. 2001-345653.

The gain-variable amplifying circuit illustrated in FIG. 13 is comprised of a plurality of amplifiers $96_1$ to $96_N$, and a demodulator 97 electrically connected in series to each of the amplifiers $96_1$ to $96_N$. Each of the amplifiers $96_1$ to $96_N$ is designed to have a gain different from gains of others.

In the illustrated gain-variable amplifying circuit, only an amplifier suitable for providing a desired gain is turned on, and other amplifiers are turned off. As a result, the gain-variable amplifying circuit transmits an output having a high impedance, and the amplifiers turned off are electrically separated from the demodulator 97.

In the gain-variable amplifying circuit illustrated in FIG. 11, since the variable attenuator 91 is arranged in a first stage, a loss of the variable attenuator 91 harmfully influences a noise index, and hence, it would not be possible to have a better noise index.

In addition, since the amplifier 92 keeps carrying out amplification, power is consumed regardless of whether a desired amplification degree is high or low, power. For instance, even if an input is high and hence it is not necessary to have a high amplification degree, the amplifier 92 keeps carrying out amplification. Accordingly, in a device which operates with a battery having a limited lifetime, such as a mobile terminal, it would not be possible to extend a period of time during which the device is usable.

Since the gain-variable amplifying circuit illustrated in FIG. 12 includes a plurality of switches (specifically, two switches), it is necessary to compensate for a loss caused by the switches by the amplifier 94 or an amplifier (not illustrated) arranged at a later stage in the gain-variable amplifying circuit. Thus, power consumption of the gain-variable amplifying circuit is increased.

In particular, a loss caused by the switches in a frequency band beyond a couple of GHz is quite high, and hence, power consumption necessary for having a desired gain would be further increased.

A frequency to which the gain-variable amplifying circuit illustrated in FIG. 13 can be applied is equal to or smaller than a couple of tens of MHz, such as IF band. Each of the amplifiers $96_1$ to $96_N$ is designed to have a load resistance in the range of about 50 to about 200 ohms. However, since an impedance in an off-condition lowers because of parasitic capacity of a semiconductor device, when a frequency is over GHz, an amplifier(s) turned off cannot transmit an output having a sufficiently high impedance.

In order to broaden a variable range of a gain or to narrow a variable step of a gain, it would be necessary to increase a number of amplifiers electrically connected in parallel to one another. However, a signal is not transmitted to a next stage due to an impedance of an amplifier(s) turned off, resulting in reduction in a gain.

In view of the above-mentioned problems in the prior art, it is an object of the present invention to provide an amplifying circuit capable of accomplishing high-impedance input/output, and providing a high gain in low power consumption.

It is also an object of the present invention to provide a gain-variable amplifying circuit including a plurality of the above-mentioned amplifying circuits, having superior noise characteristics, and providing a broad band in which a gain is variable.

DISCLOSURE OF THE INVENTION

In order to accomplish the above-mentioned object, the present invention provides an amplifying circuit including an amplifier amplifying a signal received through an input terminal, and outputting the signal through an output terminal, and a control circuit turning at least one of an input impedance and an output impedance of the amplifier into a high impedance.

In the amplifying circuit in accordance with the present invention, the control circuit turns at least one of an input impedance and an output impedance of the amplifier into a high impedance. Hence, it would be possible to select one of electrical connection and disconnection without arranging a switch in a signal path, ensuring no loss caused by arranging a switch in a signal path.

For instance, the control circuit may be comprised of an inductor and a switch, in which case, the inductor and the switch may be electrically connected in series to each other, and further electrically connected in an AC manner between the input or output terminal and a grounded voltage.

The control circuit having the above-mentioned structure can cancel reduction in an impedance in a high-frequency band caused by a parasitic capacity of the amplifier, with the inductor.

For instance, the switch is comprised of a field effect transistor.

It is preferable that the inductor has an inductance resonating in parallel with a parasitic capacity of the amplifier.

The inductor which resonates in parallel with a parasitic capacity of the amplifier at a particular frequency cancels reduction in an impedance in a high-frequency band caused by a parasitic capacity of the amplifier.

For instance, the control circuit may be comprised of at least two transmission lines including at least a first transmission line electrically connected at one end thereof to the input or output terminal, and a second transmission line grounded at one end thereof, a total length of the at least two transmission lines being equal to K×S wherein K indicates an odd number, and S indicates a quarter of a wavelength of the signal, and a switch for selecting whether the input or output terminal is electrically connected to a grounded voltage through a transmission line having a length of K×S or through a transmission line having a length shorter than K×S.

It is preferable that the transmission line having a length shorter than K×S acts as an inductor having an inductance resonating in parallel with a parasitic capacity of the amplifier.

For instance, the amplifier may be comprised of two field effect transistors electrically connected in cascode to each other.

The amplifying circuit in accordance with the present invention may further include a field effect transistor electrically connected in series between the amplifier and a power source, in which case, the field effect transistor interrupts a current from flowing to the amplifying circuit from the power source when the amplifying circuit is off.

The amplifying circuit in accordance with the present invention may be constructed as a differential amplifying circuit, in which case, the amplifying circuit further includes a field effect transistor as a constant-current source between the amplifier and a grounded voltage.

The present invention further provides a gain-variable amplifying circuit comprising at least two amplifying circuits electrically connected in parallel to each other and having gains different from one another, the amplifying circuits each comprised of the above-mentioned amplifying circuits, wherein a gain is controlled by turning at least one of the input and output impedances of any one of the at least two amplifying circuits or an amplifying circuit(s) other than a selected amplifying circuit, into a high impedance.

BRIEF DESCRIPTION OF THE DRAWINGS

FIG. 8($b$) is a circuit diagram showing characteristics of a conventional gain-variable amplifying circuit.

INDICATION BY REFERENCE NUMERALS

Figure 1:
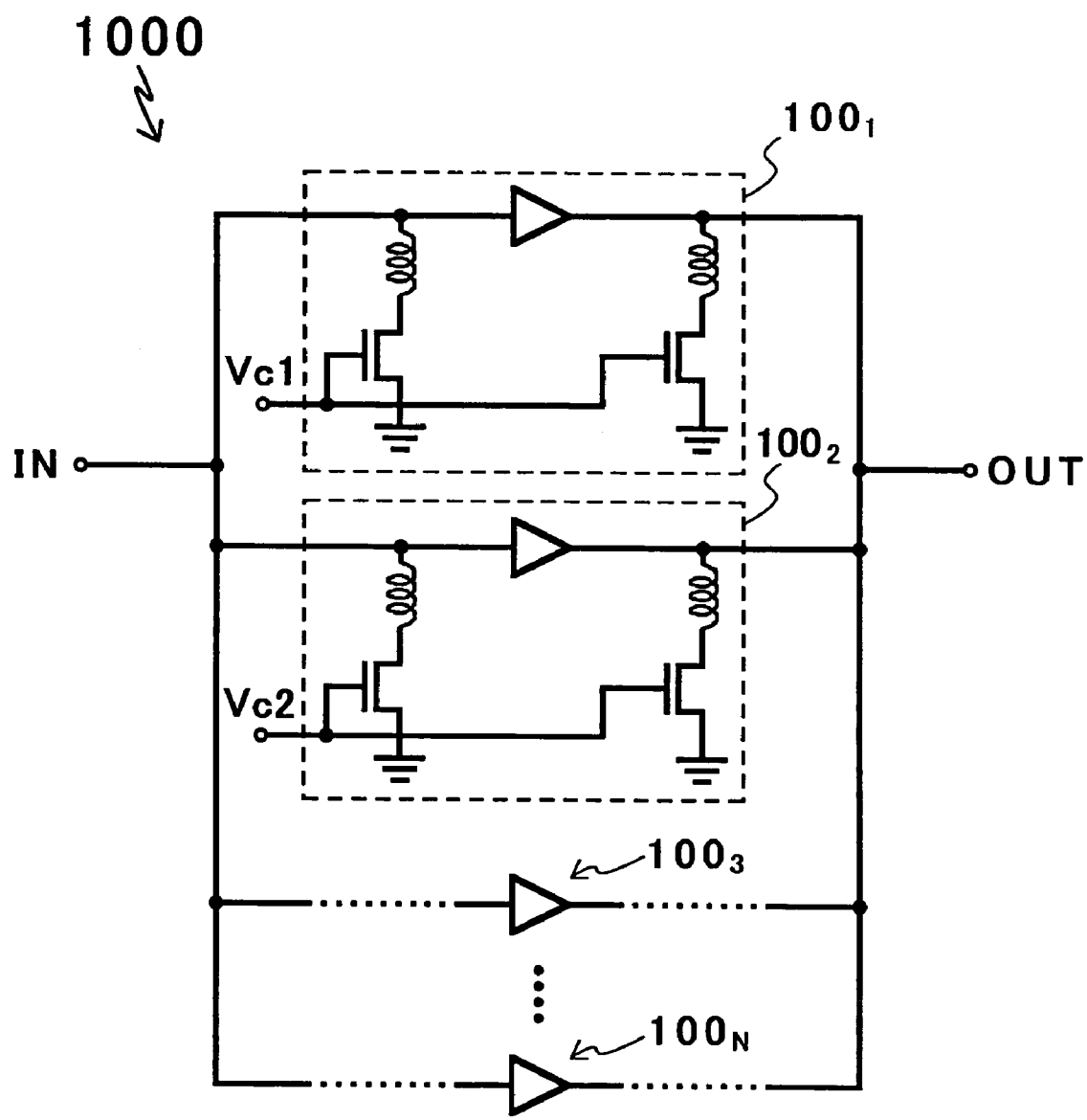
FIG. 1 is a circuit diagram of a gain-variable amplifying circuit in accordance with an embodiment of the present invention.

1000 Gain-variable amplifying circuit in accordance with an embodiment of the present invention
$100_1$-$100_N$ Amplifying circuit
100A Amplifying circuit (First example)
100B Amplifying circuit (Second example)
100C Amplifying circuit (Third example)
100D Amplifying circuit (Fourth example)
100E Amplifying circuit (Fifth example)
201 First inductor
203 Second inductor
204 Third inductor
205 Fourth inductor
206 Fifth inductor
202 Resistor
207 Capacitor
208 First field effect transistor
209 Second field effect transistor
210 Third field effect transistor
301, 303, 304, 305, 306 Inductor
307, 320, 321 Capacitor
400 Fourth field effect transistor
401 Fifth field effect transistor
601$a$, 601$b$, 603$a$, 603$b$, 604$a$, 604$b$, 605$a$, 605$b$, 606$a$, 606$b$ Inductor
602$a$, 602$b$ Resistor
607$a$, 607$b$ Capacitor
608$a$, 608$b$, 609$a$, 609$b$, 610$a$, 610$b$, 611$a$, 611$b$ Field effect transistor
613 Sixth field effect transistor
721 First transmission line
722 Second transmission line
723 Third transmission line
720 First field effect transistor
724 Second field effect transistor
725 Third field effect transistor
726 Output matching circuit
830, 832, 833 Amplifying circuit 831 Attenuator
IN Input terminal
OUT Output terminal

DETAILED DESCRIPTION OF THE PREFERRED EMBODIMENTS

Preferred embodiments in accordance with the present invention will be explained hereinbelow with reference to drawings.

FIG. 1 is a circuit diagram of a gain-variable amplifying circuit 1000 in accordance with an embodiment of the present invention. The gain-variable amplifying circuit 1000 in accordance with an embodiment of the present invention includes N amplifying circuits $100_1$ to $100_N$ (N indicates an integer equal to or greater than 2). The N amplifying circuits $100_1$ to $100_N$ are electrically connected in parallel to one another between an input terminal IN and an output terminal OUT.

Input terminals of the amplifying circuits $100_1$ to $100_N$ are electrically connected to the input terminal N, and output terminals of the amplifying circuits $100_1$ to $100_N$ are electrically connected to the output terminal OUT.

The amplifying circuits $100_1$ to $100_N$ are designed to have the same structure as one another, but have gains different from one another.

Control voltages Vc1 to VcN applied to the amplifying circuits $100_1$ to $100_N$, respectively, cause the amplifying circuits $100_1$ to $100_N$ to have a high impedance. Furthermore, the control voltages Vc1 to VcN make it possible to select whether the amplifying circuits $100_1$ to $100_N$ are electrically connected to the input terminal IN and the output terminal OUT. Accordingly, it is possible for the gain-variable amplifying circuit 1000 to have a desired gain by selecting any one of the amplifying circuits $100_1$ to $100_N$ and causing the selected amplifying circuit or other amplifying circuits to have a high impedance.

Figure 2:
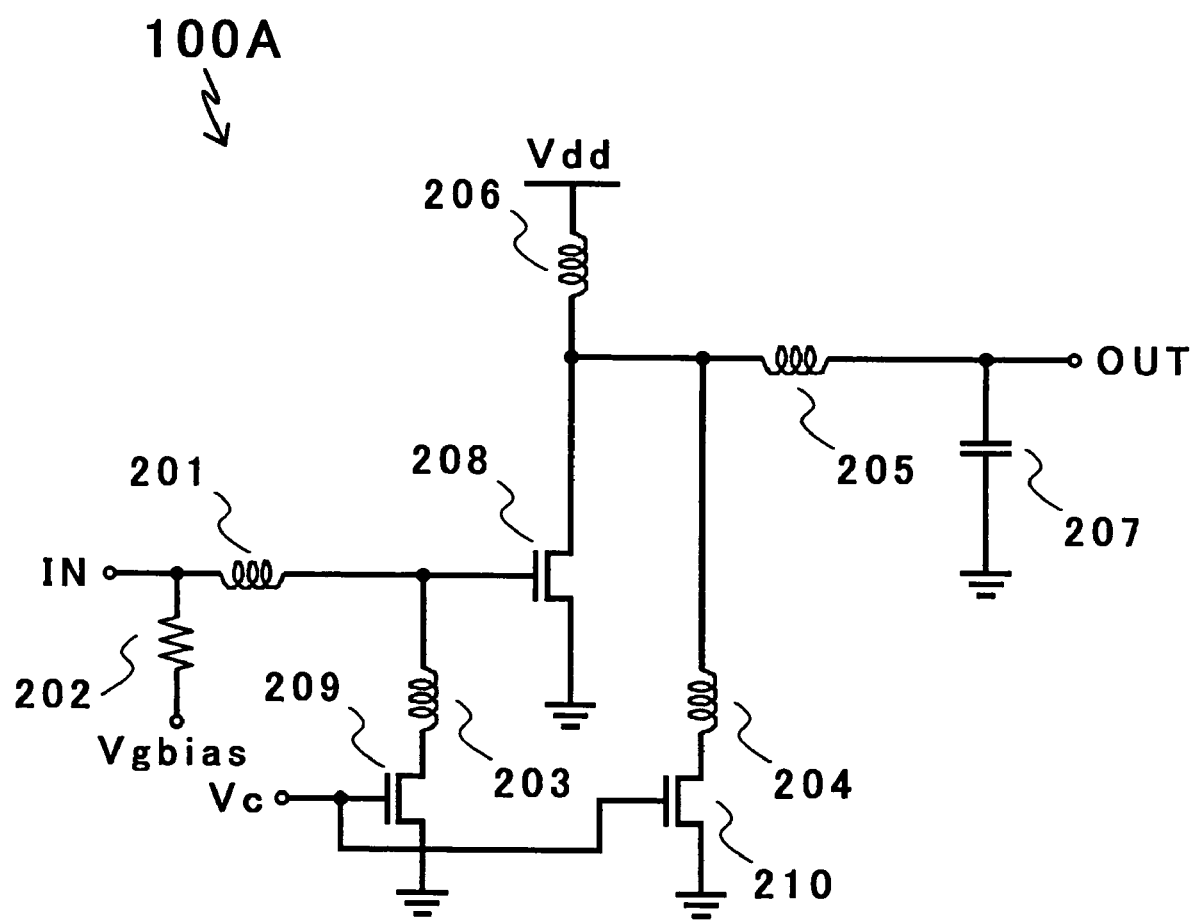
FIG. 2 is a circuit diagram of a first example of an amplifying circuit as a part of the gain-variable amplifying circuit illustrated in FIG. 1.

FIG. 2 is a circuit diagram of a first example of the amplifying circuits $100_1$ to $100_N$ as a part of the gain-variable amplifying circuit 1000 in accordance with an embodiment of the present invention.

An amplifying circuit 100A in accordance with the first example is a single-end type amplifying circuit.

As illustrated in FIG. 2, the amplifying circuit 100A is comprised of a first inductor 201, a second inductor 203, a third inductor 204, a fourth inductor 205, a fifth inductor 206, a resistor 202, a capacitor 207, a first field effect transistor 208, a second field effect transistor 209, and a third field effect transistor 210.

The first inductor 201 is electrically connected at one end to both the input terminal IN and an end of the resistor 202, and at the other end to a gate of the first field effect transistor 208 and an end of the second inductor 203.

The resistor 202 is electrically connected at the above-mentioned end thereof to the input terminal IN and an end of the first inductor 201, and at the other end to a gate bias voltage Vgbias.

The second inductor 203 is electrically connected at the above-mentioned end thereof to the other and of the first inductor 201 and a gate of the first field effect transistor 208, and at the other end to a drain of the second field effect transistor 209.

The first field effect transistor 208 is electrically connected at a gate thereof to the other end of the first inductor 201 and the above-mentioned end of the second inductor 203, and at a drain thereof to ends of the third inductor 204, the fourth inductor 205 and the fifth inductor 206, and grounded at a source thereof.

A control voltage Vc is applied to a gate of the second field effect transistor 209. The second field effect transistor 209 is electrically connected at a drain thereof to the other end of the second inductor 203, and grounded at a source thereof.

The third inductor 204 is electrically connected at an end thereof to ends of the fourth inductor 205 and the fifth inductor 206 and a drain of the first field effect transistor 208, and at the other end to a drain of the third field effect transistor 210.

A control voltage Vc is applied to a gate of the third field effect transistor 210. The third field effect transistor 210 is electrically connected at a drain thereof to the other end of the third inductor 204, and grounded at a source thereof.

The fifth inductor 206 is electrically connected at an end thereof to ends of the third inductor 204 and the fourth inductor 205 and a drain of the first field effect transistor 208, and receives a power-source voltage Vdd at the other end thereof.

The fourth inductor 205 is electrically connected at an end thereof to ends of the third inductor 204 and the fifth inductor 206 and a drain of the first field effect transistor 208, and at the other end to an end of the capacitor 207 and the output terminal OUT.

The capacitor 207 is electrically connected at the above-mentioned end thereof to the other end of the fourth inductor 205 and the output terminal OUT, and grounded at the other end thereof.

The first inductor 201, the fourth inductor 205, the fifth inductor 206, and the capacitor 207 define an input/output matching circuit. In addition, the fifth inductor 206 acts also as a choke inductor. The resistor 202 applies a gate bias to an input signal.

The first field effect transistor 208 acts as a main amplifying device in the amplifying circuit 100A. The control voltage Vc is used to turn on or off the amplifying circuit 100A.

The second and third field effect transistors 209 and 210 both acting as a switching device and the second and third inductors 203 and 204 both for making resonation define a control circuit. The amplifying circuit 100A is turned on or off by controlling the control circuit.

For instance, if the control voltage Vc is set a high level (for instance, the power-source voltage Vdd), and the gate bias voltage Vgbias is set equal to 0V, the amplifying circuit 100A is turned off. As an alternative, if the control voltage Vc is set a low level (for instance, 0V), and the gate bias voltage Vgbias is set equal to an operational voltage, the amplifying circuit 100A is turned on. Herein, the operational voltage is defined as a gate bias voltage at which the first field effect transistor 208 operates as an amplifier.

When the amplifying circuit 100A is on, the amplifying circuit 100A is electrically connected to both the input terminal IN and the output terminal OUT, and amplifies a signal received through the input terminal IN and transmits the amplified signal to the output terminal OUT.

When the amplifying circuit 100A is off, the amplifying circuit 100A has a high impedance in input and output thereof, and hence, the amplifying circuit 100A is electrically separated from both the input terminal IN and the output terminal OUT.

Figure 3:
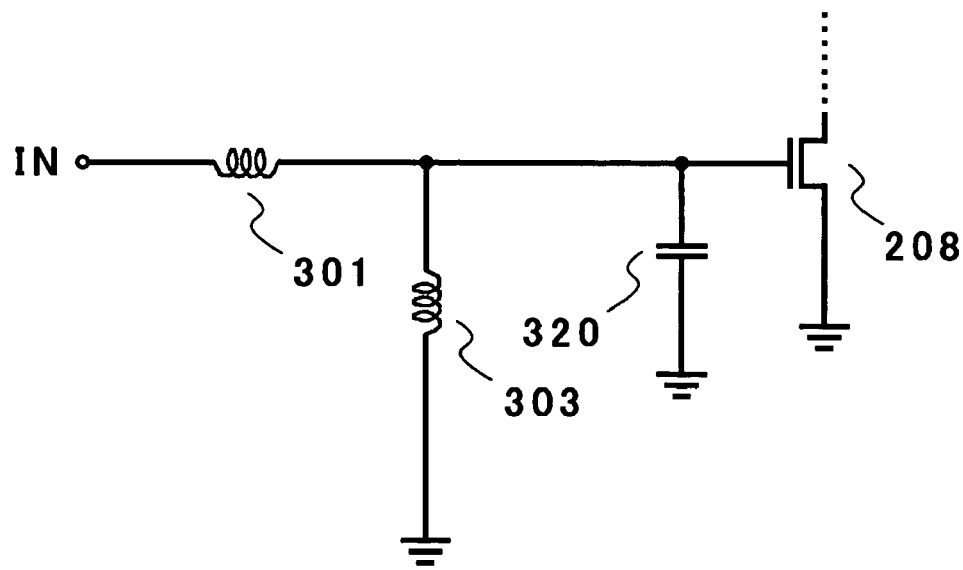
FIG. 3 illustrates a principle about why the amplifying circuit illustrated in FIG. 2 is in a high-impedance condition.
Figure 3:
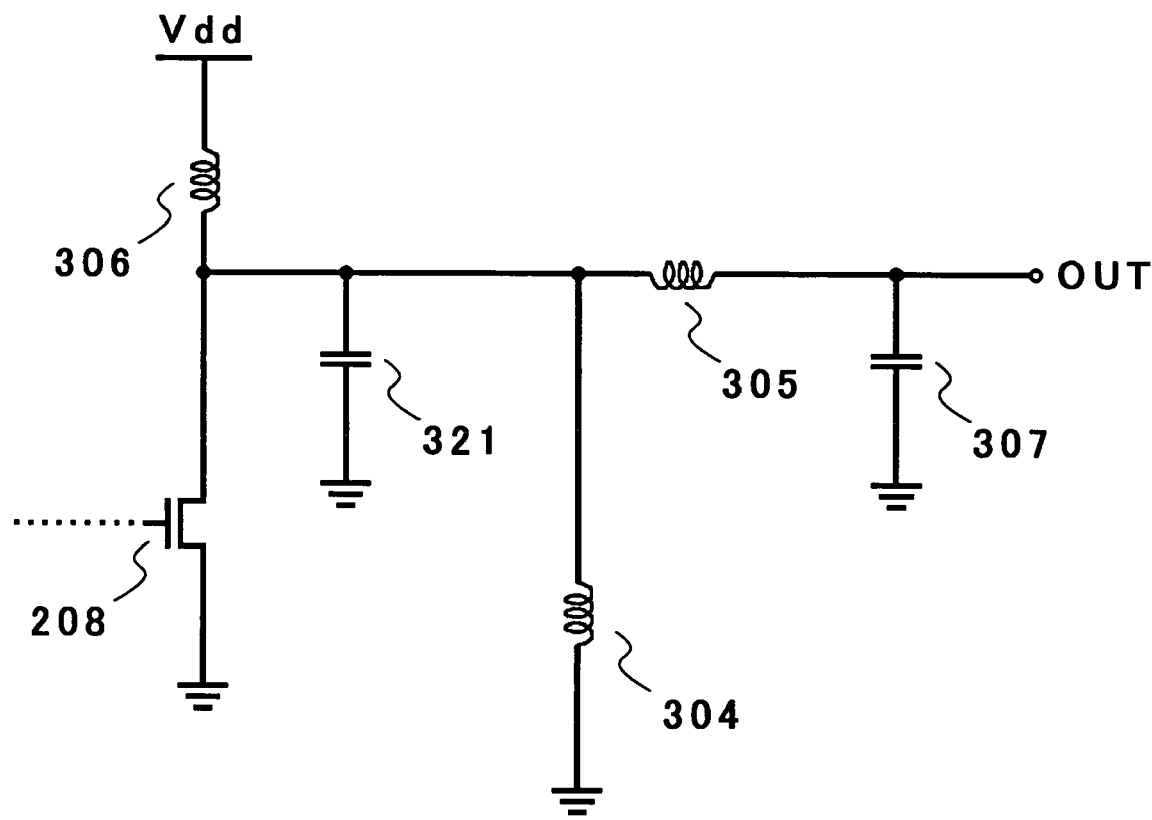

FIG. 3 shows a principle as to why the amplifying circuit 100A illustrated in FIG. 2 has a high impedance. Hereinbelow, the principle is explained with reference to FIG. 3.

FIG. 3(a) is a circuit diagram of an equivalent circuit of an input of the amplifying circuit 100A in the case that the control signal Vc is set a high level to turn the second and third field effect transistors 209 and 210 are turned on, and the gate bias voltage Vgbias is set equal to 0V. FIG. 3(b) is a circuit diagram of an equivalent circuit of an output of the amplifying circuit 100A in the same case.

In FIG. 3(a), an inductor 301 corresponds to the first inductor 201, and an inductor 303 corresponds to the second inductor 203. In FIG. 3(b), an inductor 306, an inductor 305, a capacitor 307, and an inductor 304 correspond to the fifth inductor 206, the fourth inductor 205, the capacitor 207, and the third inductor 204, respectively.

In FIGS. 3(a) and 3(b), since the gate bias voltage Vgbias is set equal to 0V, the first field effect transistor 208 is off. Hence, viewing from a gate of the first field effect transistor 208 (FIG. 3(a)) or viewing from a drain of the same (FIG. 3(b)), the circuits illustrated in FIGS. 3(a) and 3(b) have a capacity equal to a gate or drain capacity of an intrinsic semiconductor of a device, that is, the capacitor 320 or 321, respectively.

In the circuit illustrated in FIG. 3(a), the inductor 303 is designed to have such an inductance that the inductor 303 and the capacitor 320 resonate with each other in parallel. Similarly, in the circuit illustrated in FIG. 3(b), the inductor 304 is designed to have such an inductance that the inductor 304 and the capacitor 321 resonate with each other in parallel. Thus, it is possible to make input and output impedances high.

The capacitors 320 and 321 have a capacity dependent on a generation of a process and a gate size. For instance, the capacitors 320 and 321 have about 300 fF in a field effect transistor having a gate width of 300 micrometers. If a capacity is equal to about 300 fF, the inductors 303 and 304 in an amplifying circuit which operates at a frequency of 5 GHz have an inductance of about 3 nH. Inductors having such an inductance can be readily fabricated on an IC by wire arrangement.

When the amplifying circuit 100A is on and carries out normal amplification, the second and third field effect transistors 209 and 210 are off. Since the second and third field effect transistors 209 and 210 are not arranged in a signal path between the input terminal IN and the output terminal OUT, a resistance during they are off is set high. Furthermore, a shunt parasitic capacity during they are off is set low, resulting in a high impedance. Accordingly, when the second and third field effect transistors 209 and 210 are off, the inductors 303 and 304 are in a floating condition.

As having been explained above, it is possible in the amplifying circuit 100A to make an input/output impedance high in a high-frequency band beyond GHz order without arranging a switch into a signal path.

Thus, in the gain-variable amplifying circuit 1000 including the amplifying circuits 1001 to 100N having the same structure as that of the amplifying circuit 100A and electrically connected in parallel with one another, even if a range in which a gain varies is set broad or even if a step by which a gain varies is set narrow, it would be possible to maintain a high gain and a low noise indication.

Furthermore, since it is possible to maintain a high gain in the gain-variable amplifying circuit 1000, even if a number of amplifying circuits electrically connected in parallel to one another is increased, it would be possible to avoid an increase in current consumption. In particular, the avoidance of an increase in current consumption is remarkable in a high-frequency band beyond GHz.

Figure 4:
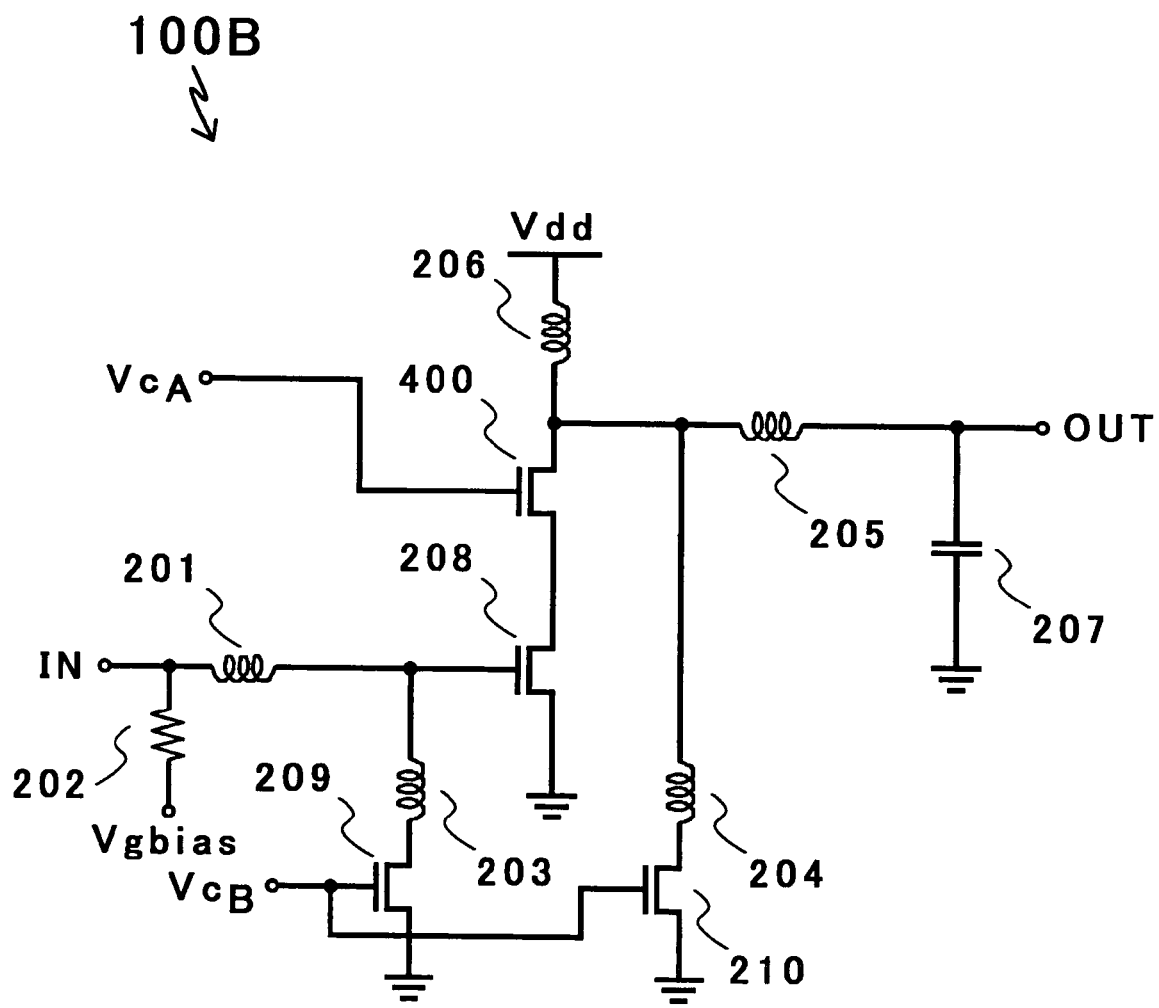
FIG. 4 is a circuit diagram of a second example of an amplifying circuit as a part of the gain-variable amplifying circuit illustrated in FIG. 1.

FIG. 4 is a circuit diagram of a second example of the amplifying circuits $100_1$ to $100_N$ as a part of the gain-variable amplifying circuit 1000 in accordance with the embodiment of the present invention.

The amplifying circuit 100B illustrated in FIG. 4 is structurally different from the amplifying circuit 100A illustrated in FIG. 2 in including a fourth field effect transistor 400 acting as a second amplifier. The first field effect transistor 208 acting as a first amplifier, and the fourth field effect transistor 400 are electrically connected in cascode to each other.

A first control voltage VcA is applied to a gate of the fourth field effect transistor 400. The fourth field effect transistor 400 has a drain electrically connected to ends of the third inductor 204, the fourth inductor 205 and the fifth inductor 206, and a source electrically connected to a drain of the first field effect transistor 208.

A second control voltage VcB is applied to each of gates of the second and third field effect transistors 209 and 210.

The first and fifth field effect transistors 208 and 400 are main amplifying devices in the amplifying circuit 100B.

The first and second control voltages VcA and VcB are used for turning on or off the amplifying circuit 100B, and are complementary with each other.

The second and third field effect transistors 209 and 210 and the second and third inductors 203 and 204 define a control circuit. The amplifying circuit 100B is turned on or off by controlling the control circuit.

For instance, if the first control voltage VcA is set a low level and the second control voltage VcB is set a high level, and the gate bias voltage Vgbias is set equal to 0V, the amplifying circuit 100B is turned off. On the other hand, if the first control voltage VcA is set a high level and the second control voltage VcB is set a low level, and the gate bias voltage Vgbias is set equal to an operational voltage, the amplifying circuit 100B is turned on. Herein, the operational voltage is defined as a gate bias voltage at which the first field effect transistor 208 operates as an amplifier.

When the amplifying circuit 100B is on, the amplifying circuit 100B is electrically connected to both the input terminal IN and the output terminal OUT, and amplifies a signal received through the input terminal IN and transmits the amplified signal to the output terminal OUT.

When the amplifying circuit 100B is off, the amplifying circuit 100B has a high impedance in input and output thereof, and hence, the amplifying circuit 100B is electrically separated from both the input terminal IN and the output terminal OUT.

A principle in accordance with which the amplifying circuit 100B is in a high-impedance condition is identical with the principle in accordance with which the amplifying circuit 100A illustrated in FIG. 2 is in a high-impedance condition.

In the amplifying circuit 100B, since the field effect transistors 208 and 400 are electrically connected in cascode to each other, a capacity between the input terminal IN and the output terminal OUT is smaller than the same in the amplifying circuit 100A, ensuring that the amplifying circuit 100B can operate in a higher frequency band than the same of the amplifying circuit 100B illustrated in FIG. 2.

Figure 5:
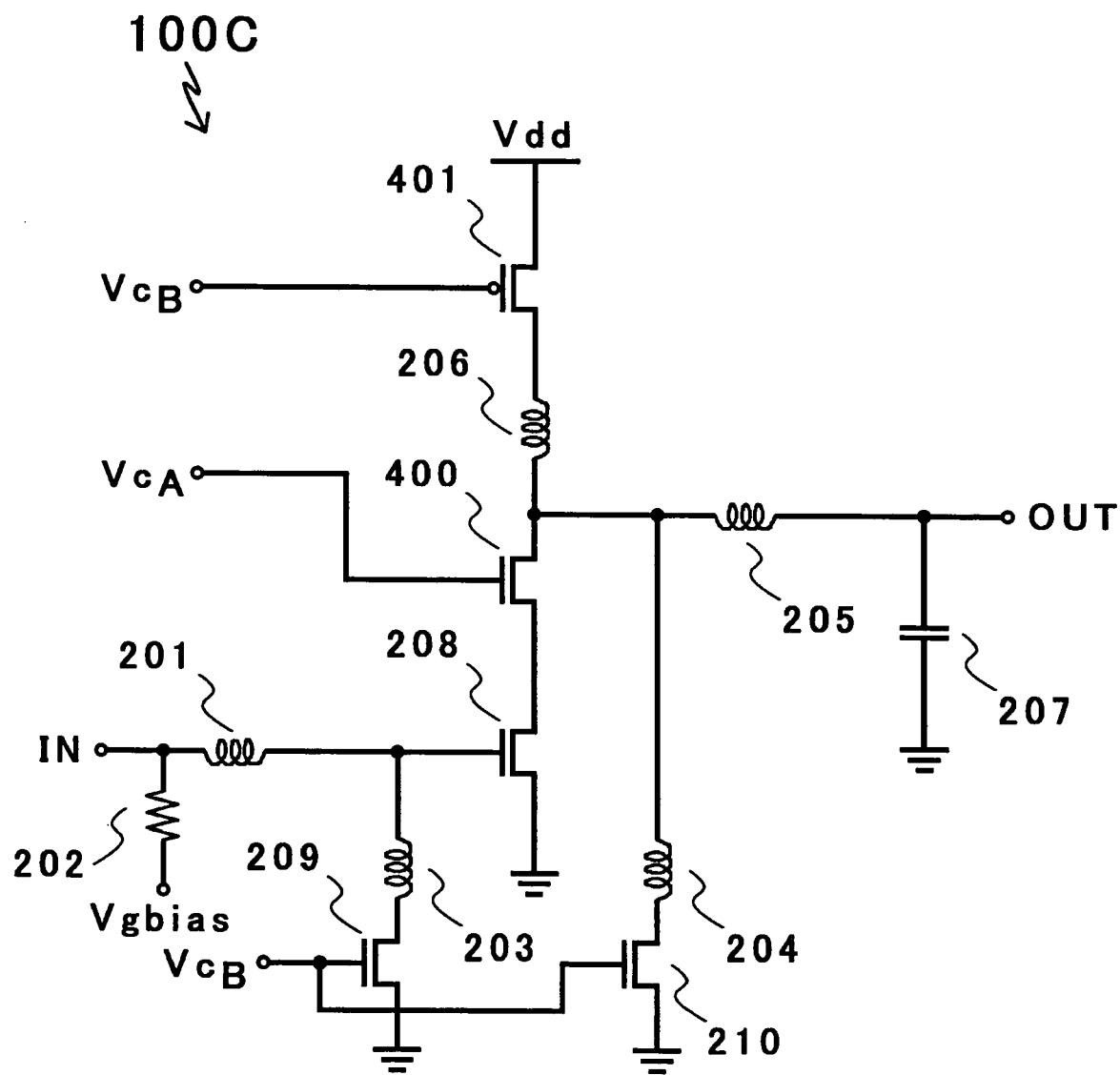
FIG. 5 is a circuit diagram of a third example of an amplifying circuit as a part of the gain-variable amplifying circuit illustrated in FIG. 1.

FIG. 5 is a circuit diagram of a third example of the amplifying circuits $100_1$ to $100_N$ as a part of the gain-variable amplifying circuit 1000 in accordance with the embodiment of the present invention.

The amplifying circuit 100C illustrated in FIG. 5 is structurally different from the amplifying circuit 100B illustrated in FIG. 4 in further including a fifth field effect transistor 401 acting as a current breaker.

The fifth field effect transistor 401 is electrically connected in series between the matching inductor 206 and the power-source voltage Vdd. Specifically, the fifth field effect transistor 401 has a gate to which a second control voltage VcB is applied, a drain to which the power-source voltage Vdd is applied, and a source electrically connected to an end of the fifth inductor 206.

The fifth field effect transistor 401 interrupts a current flow from the power source to the amplifying circuit 100C, when the amplifying circuit 100C is off.

Figure 6:
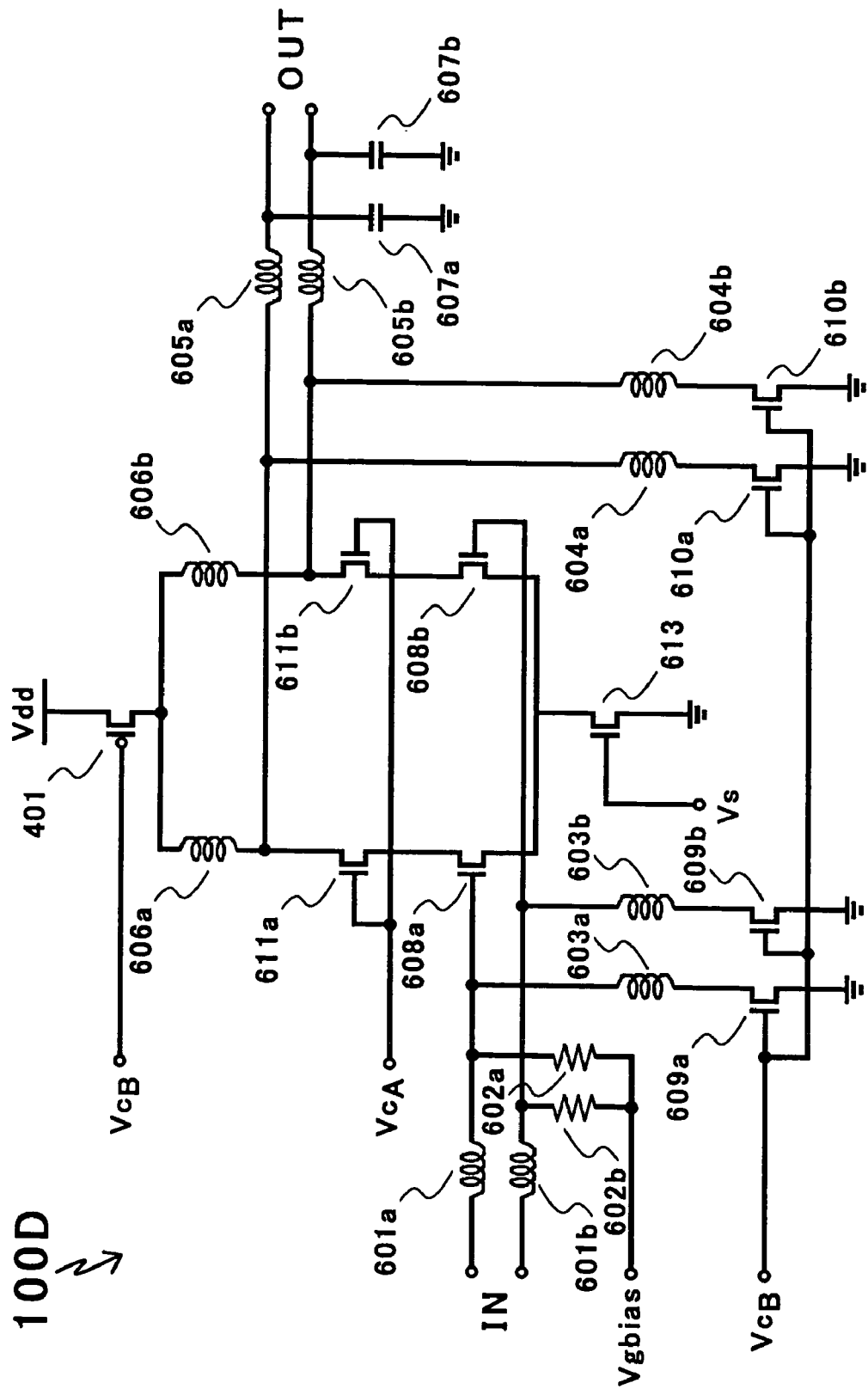
FIG. 6 is a circuit diagram of a fourth example of an amplifying circuit as a part of the gain-variable amplifying circuit illustrated in FIG. 1.

FIG. 6 is a circuit diagram of a fourth example of the amplifying circuits $100_1$ to $100_N$ as a part of the gain-variable amplifying circuit 1000 in accordance with the embodiment of the present invention.

The amplifying circuit 100D illustrated in FIG. 6 is structurally different from the amplifying circuit 100C illustrated in FIG. 5 in the amplifying circuit 100D is comprised of a differential amplifying circuit, and in further including a sixth field effect transistor 613 acting as a constant-current source.

The amplifying circuit 100D has a basic circuit structure identical with that of the amplifying circuit 100C illustrated in FIG. 5. However, the parts constituting the amplifying circuit 100C are replaced with other parts as follows in the amplifying circuit 100D except the fifth field effect transistor 401.

The first inductor 201 is replaced with a pair of inductors 601a and 601b arranged in parallel with each other. The resistor 202 is replaced with a pair of resistors 602a and 602b electrically connected to the inductors 601a and 601b, respectively. The second inductor 203 is replaced with a pair of inductors 603a and 603b. The second field effect transistor 209 is replaced with a pair of field effect transistors 609a and 609b.

The fifth inductor 206 is replaced with a pair of inductors 606a and 606b. The fourth field effect transistor 400 is replaced with a pair of field effect transistors 611a and 611b. The first field effect transistor 208 is replaced with a pair of field effect transistors 608a and 608b. The third inductor 204 is replaced with a pair of inductors 604a and 604b. The third field effect transistor 210 is replaced with a pair of field effect transistors 610a and 610b.

The fourth inductor 205 is replaced with a pair of inductors 605a and 605b. The capacitor 207 is replaced with a pair of capacitors 607a and 607b.

The sixth field effect transistor 613 is arranged between sources of the first field effect transistors 608a and 608b both acting as an amplifier, and a grounded voltage. Specifically, the sixth field effect transistor 613 has a gate to which a gate bias voltage Vs as an operational voltage is applied, a drain electrically connected to sources of the first field effect transistors 608a and 608b, and a source grounded.

When the gate bias voltage Vgbias applied to the gates of the first field effect transistors 608a and 608b, and the gate bias voltage Vs applied to the gate of the sixth field effect transistor 613 are set equal to an operational voltage, and the control voltage VcA is set equal to a high level, the fourth field effect transistors 211a and 211b and the fifth field effect transistor 401 are turned on, and the second field effect transistors 609a and 609b and the third field effect transistors 610a and 610b are turned off. As a result, the second inductors 603a and 603b and the third inductors 604a and 604 are put into a floating condition, and hence, the amplifying circuit 100D carries out amplification.

In contrast, when the control voltage VcA is set equal to a low level, the fourth field effect transistor 611a and 611b and the fifth field effect transistor 401 are turned off, and the second field effect transistors 609a and 609b and the third field effect transistors 610a and 610b are turned on. The second inductors 603a and 603b and the third inductors 604a and 604b are grounded, and resonate in parallel with capacities of the second field effect transistors 609a and 609b and the third field effect transistors 610a and 610b. As a result, the amplifying circuit 100D has a high input/output impedance.

Figure 7:
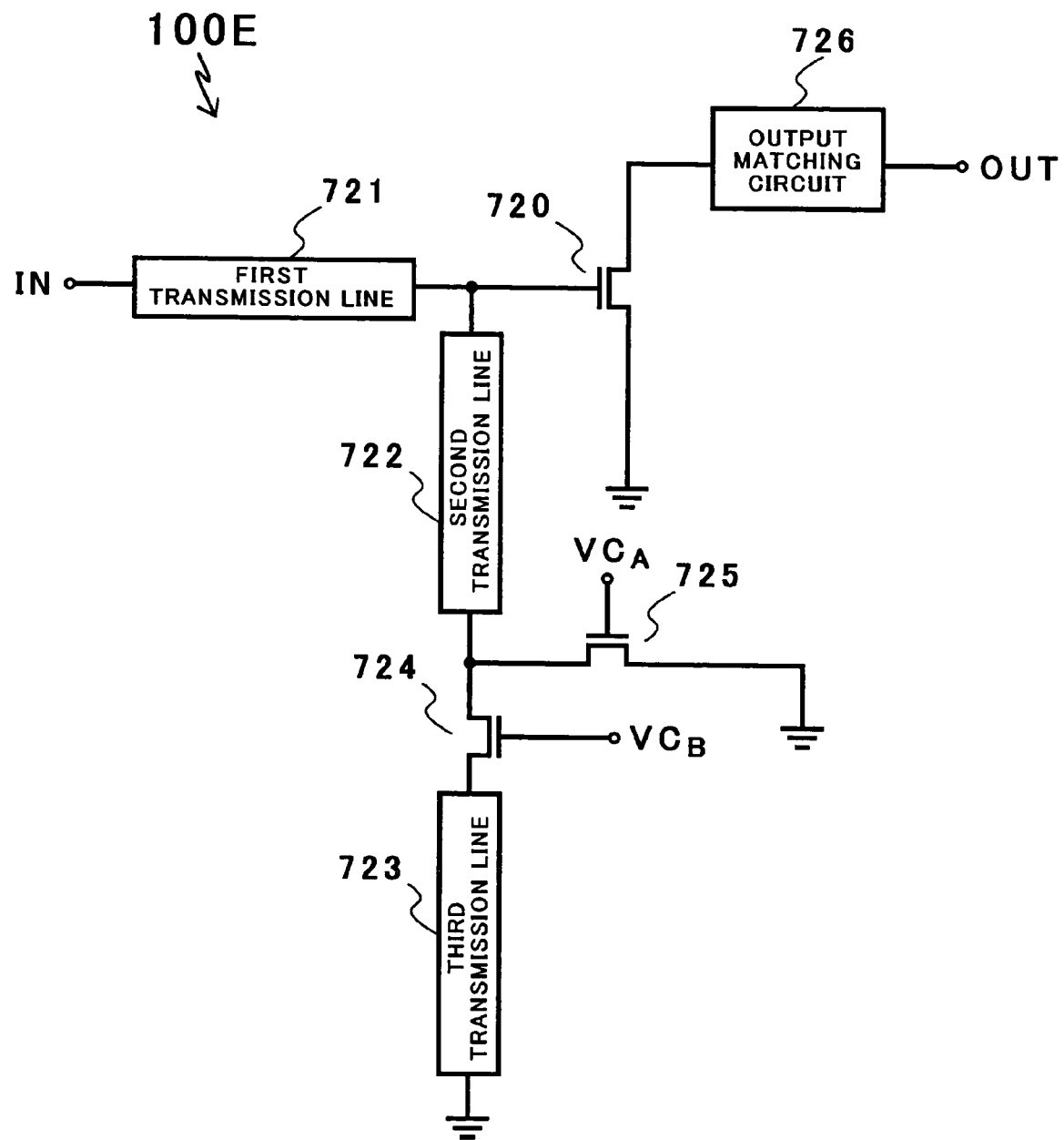
FIG. 7 is a circuit diagram of a fifth example of an amplifying circuit as a part of the gain-variable amplifying circuit illustrated in FIG. 1.

FIG. 7 is a circuit diagram of a fifth example of the amplifying circuits $100_1$ to $100_N$ as a part of the gain-variable amplifying circuit 1000 in accordance with the embodiment of the present invention.

The amplifying circuit 100E illustrated in FIG. 7 is comprised of transmission lines.

As illustrated in FIG. 7, the amplifying circuit 100E is comprised of a first transmission line 721, a second transmission line 722, a third transmission line 723, a first field effect transistor 720, a second field effect transistor 724, a third field effect transistor 725, and an output matching circuit 726.

The first transmission line 721 is connected at one end thereof to the input terminal IN, and at the other end thereof to an end of the second transmission line 722 and a gate of the first field effect transistor 720.

The second transmission line 722 is connected at one end thereof to the other end of the first transmission line 721 and a gate of the first field effect transistor 720, and at the other end thereof to drains of the second and third field effect transistors 724 and 725.

The third transmission line 723 is connected at one end thereof to a source of the second field effect transistor 724, and at the other end thereof grounded.

The first field effect transistor 720 has a gate electrically connected to the other end of the first transmission line 721 and one end of the second transmission line 722, a drain electrically connected to the output terminal OUT through the output matching circuit 726, and a source grounded.

The second field effect transistor 724 has a gate to which a second control voltage VcB is applied, a drain electrically connected to the other end of the second transmission line 722 and a drain of the third field effect transistor 725, and a source electrically connected to one end of the third transmission line 723.

The third field effect transistor 725 has a gate to which a first control voltage VcA is applied, a drain electrically connected to the other end of the second transmission line 722 and a drain of the second field effect transistor 724, and a source grounded. The first and second control voltages VcA and VcB are complementary with each other.

The first transmission line 721 matches inputs, and the output matching circuit 726 matches outputs. The first field effect transistor 720 acts as a main amplifying device in the amplifying circuit 100E.

The second transmission line 722 has a length shorter than a quarter (¼) of a wavelength of a signal to which the amplifying circuit 100E is applied. Thus, the second transmission line 722 acts as an inductor. The length of the second transmission line 722 is designed to be such a length that an inductance of the second transmission line 722 and a gate capacity of the first field effect transistor 720 resonate in parallel with each other.

Each of the second and third transmission lines 722 and 723 is designed to have such a length that a total of the length of them is equal to a quarter (¼) or K quarter (K/4)

of a wavelength of a signal to which the amplifying circuit 100E is applied, wherein K indicates an odd number.

For simplification, an operation of the amplifying circuit 100E is explained hereinbelow only with respect to inputs thereof.

Each of the second and third field effect transistors 724 and 725 defines a single-pole single-throw (SPST) switch. The second and third field effect transistors 724 and 725 are controlled by the first and second control voltages VcA and VcB which are complementary with each other, respectively.

When the first control voltage VcA is set a high level, and the second control voltage VcB is set a low level, the second field effect transistor 724 is off, and the third field effect transistor 725 is on. Thus, the third transmission line 723 is electrically separated from the amplifying circuit 100E, and the second transmission line 722 is directly grounded. Since the second transmission line 722 has a length shorter than a quarter of the wavelength, the second transmission line 722 acts as an inductor, and further since an inductance of the inductor is designed to resonate in parallel with a gate capacity of the first field effect transistor 720, the amplifying circuit 100E is in a high-impedance condition, when viewed from the input terminal IN.

In contrast, when the first control voltage VcA is set a low level, and the second control voltage VcB is set a high level, the second field effect transistor 724 is on, and the third field effect transistor 725 is off. Thus, the third transmission line 723 is electrically connected to the second transmission line 722 through the second field effect transistor 724.

Since a total length of the second and third transmission lines 722 and 723 is equal to a quarter of the wavelength of the signal, and the third transmission line 723 is grounded at the other end, the impedance is infinite, resulting in that the second and third transmission lines 722 and 723 seems to have an infinite impedance, when viewed from a gate of the first field effect transistor 720. The second and third transmission lines 722 and 723 which seem to have an infinite impedance do not exert any influence on a gate of the first field effect transistor 720. Accordingly, the amplifying circuit 100E normally carries out amplification without being influenced by the second and third transmission lines 722 and 723.

It is necessary to set a gate bias voltage such that the first field effect transistor 720 does not carry out amplification, when the first control voltage VcA is set a high level, and the second control voltage VcB is set a low level.

Hereinbelow, the above-mentioned amplifying circuits 100A to 100E are compared with a conventional amplifying circuit with respect to performances.

Figure 8:
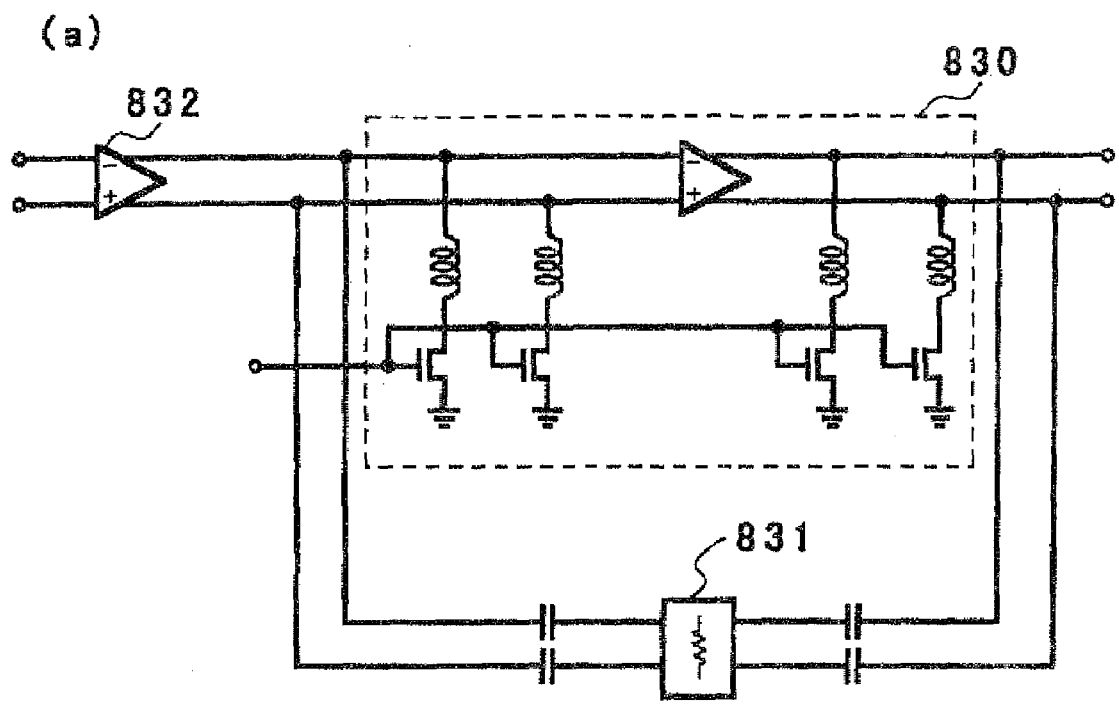
FIG. 8($a$) is a circuit diagram showing characteristics of an amplifying circuit as a part of the gain-variable amplifying circuit in accordance with an embodiment of the present invention.
Figure 8:
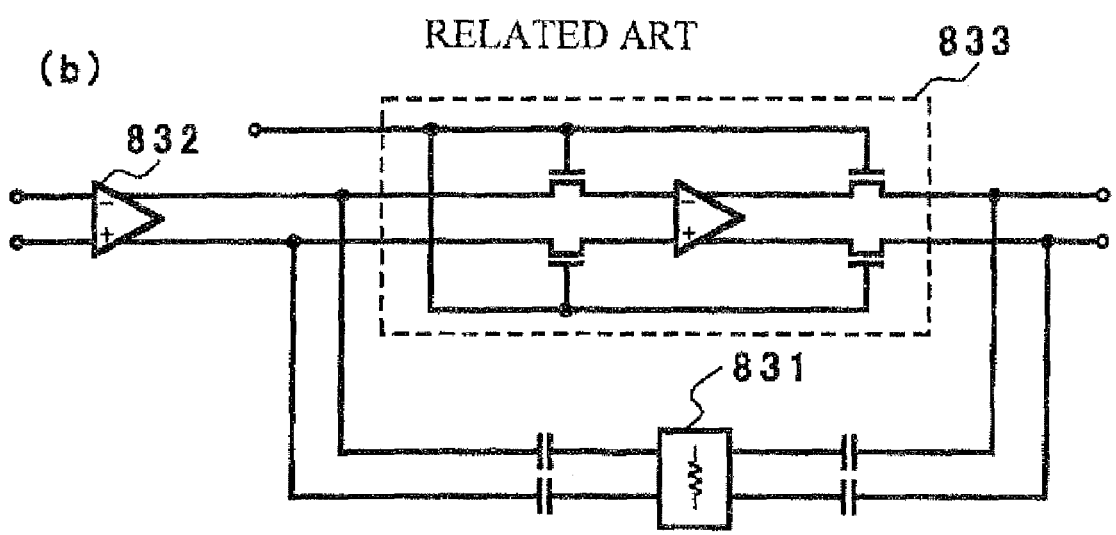

FIG. 8(a) is a circuit diagram of a gain-variable amplifying circuit including any one of the above-mentioned amplifying circuits 100A to 100E, and FIG. 8(b) is a circuit diagram of a conventional gain-variable amplifying circuit.

The gain-variable amplifying circuit illustrated in FIG. 8(a) is comprised of an amplifying circuit 832, an amplifying circuit 830 electrically connected in series to an output of the amplifying circuit 832, and an attenuator 831 electrically connected in series to an output of the amplifying circuit 832 and in parallel with the amplifying circuit 830.

The amplifying circuit 830 is designed to define a resonance circuit comprised of a gate capacity of a field effect transistor acting as an amplifier, and an inductor, by switching a field effect transistor acting as a switch. When the amplifying circuit 830 defines the resonance circuit, the amplifying circuit 830 would have a high impedance in input/output thereof, resulting in that the amplifying circuit 830 is electrically separated from the gain-variable amplifying circuit.

Specifically, the amplifying circuit 830 is comprised of any one of the above-mentioned amplifying circuits 100A to 100E.

The gain-variable amplifying circuit illustrated in FIG. 8(b) is comprised of, similarly to the gain-variable amplifying circuit illustrated in FIG. 8(a), an amplifying circuit 832, an amplifying circuit 830 electrically connected in series to an output of the amplifying circuit 832, and an attenuator 831 electrically connected in series to an output of the amplifying circuit 830 and in parallel with an amplifying circuit 833.

Unlike the amplifying circuit 830, the amplifying circuit 833 is designed to be electrically connected to the gain-variable amplifying circuit by turning on a field effect transistor acting as a switch and arranged in a signal path.

It is assumed that the gain-variable amplifying circuits illustrated in FIGS. 8(a) and 8(b) are applied to a signal having a frequency in a 5 GHz band, and are designed to have a predetermined inductance.

Figure 9:
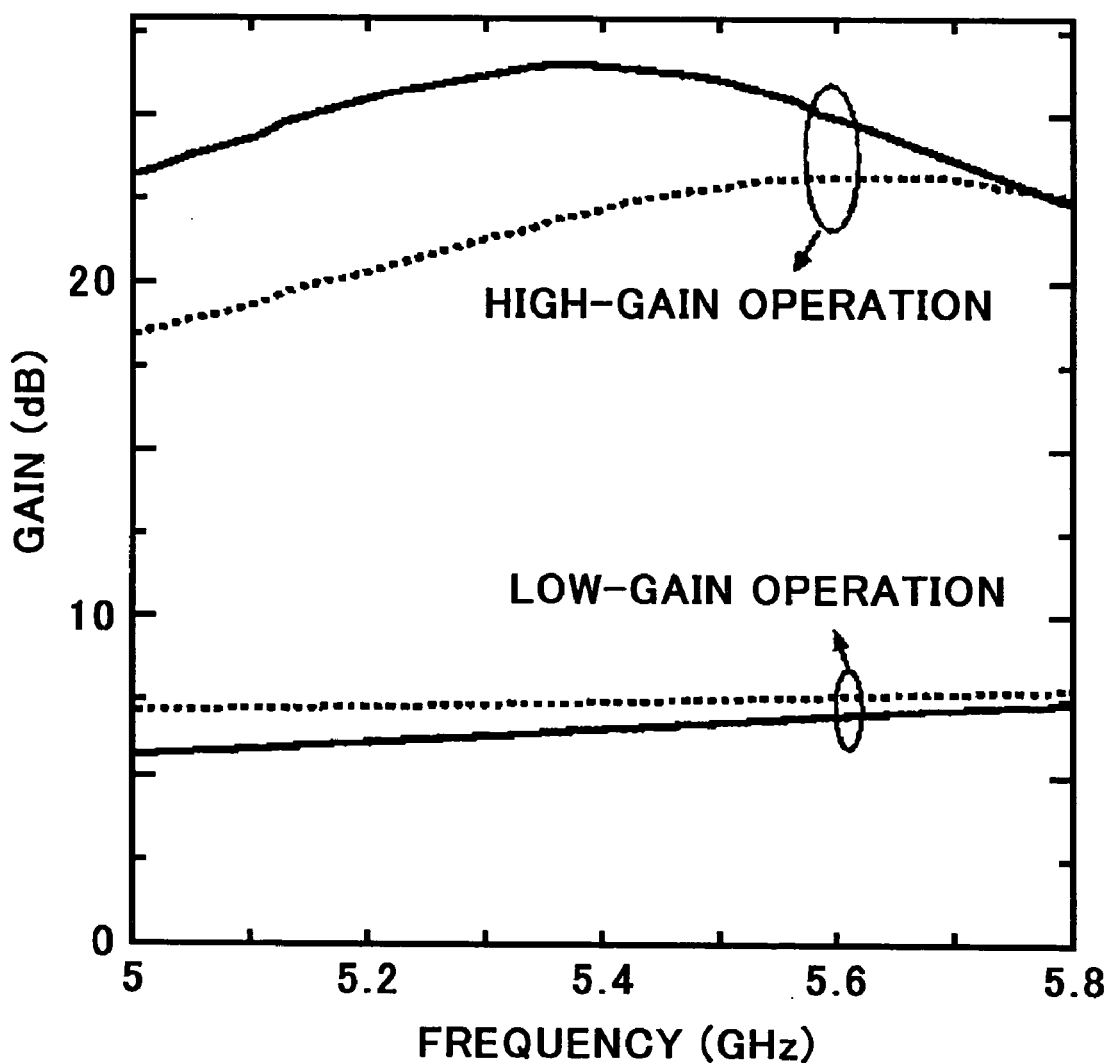
FIG. 9 is a graph showing a relation between a frequency and a gain in the gain-variable amplifying circuits illustrated in FIGS. 8($a$) and 8($b$).

FIG. 9 is a graph showing a relation between a frequency and a gain in the gain-variable amplifying circuits illustrated in FIGS. 8(a) and 8(b).

FIG. 9 shows the gain characteristic found when the amplifying circuits 830 and 833 are electrically connected to the gain-variable amplifying circuit (high-gain operation), and the gain characteristic found when the amplifying circuits 830 and 833 are electrically separated from the gain-variable amplifying circuit (low-gain operation).

Figure 10:
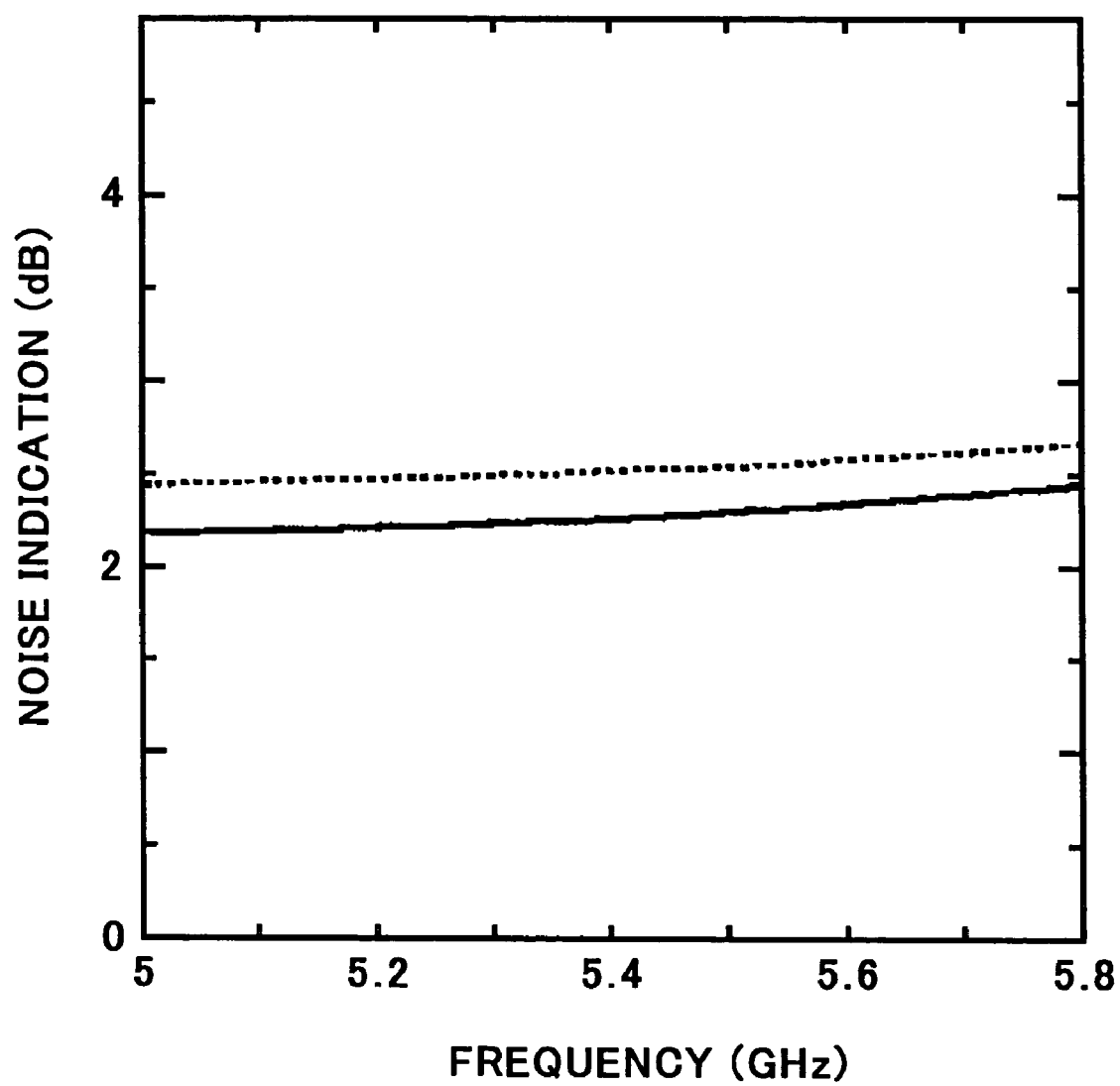
FIG. 10 is a graph showing a relation between a frequency and a noise indication in the gain-variable amplifying circuits illustrated in FIGS. 8($a$) and 8($b$).
Figure 11:
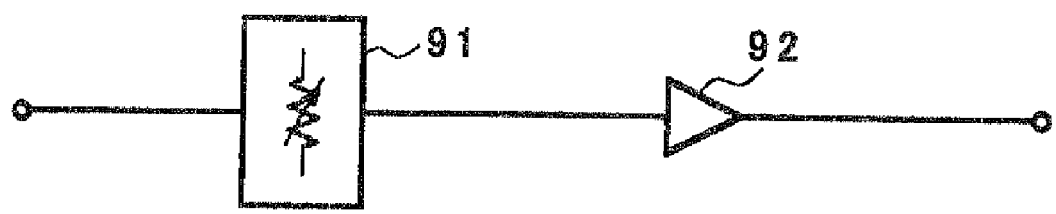
FIG. 11 is a circuit diagram of an example of a conventional gain-variable amplifying circuit.
Figure 12:
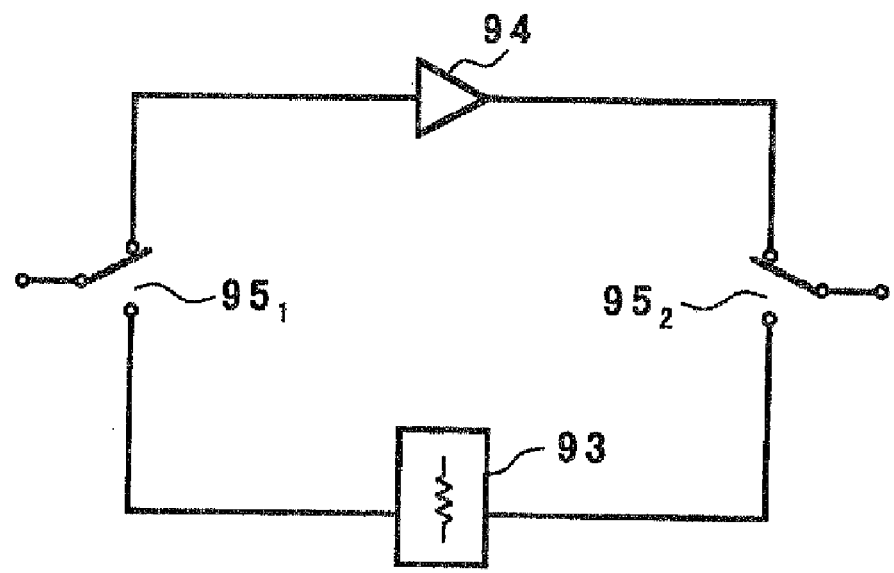
FIG. 12 is a circuit diagram of another example of a conventional gain-variable amplifying circuit.
Figure 13:
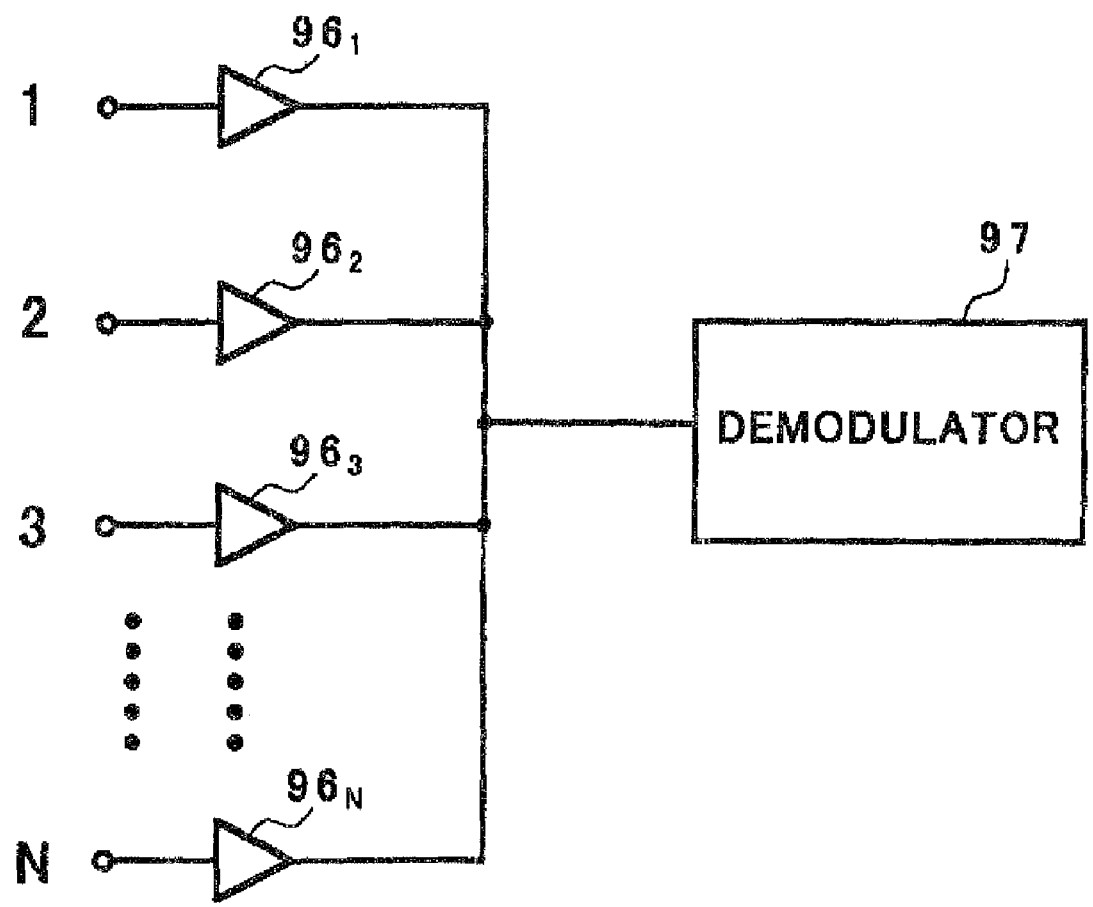
FIG. 13 is a circuit diagram of still another example of a conventional gain-variable amplifying circuit.

FIG. 10 is a graph showing a relation between a frequency and a noise indication in the gain-variable amplifying circuits illustrated in FIGS. 8(a) and 8(b).

In FIGS. 9 and 10, the characteristic of the gain-variable amplifying circuit illustrated in FIG. 8(a) is shown with a solid line, and the characteristic of the gain-variable amplifying circuit illustrated in FIG. 8(b) is shown with a broken line.

With reference to FIG. 9, a gain in the high-gain operation in the gain-variable amplifying circuit illustrated in FIG. 8(a) is higher by about 5 dB than the same in the gain-variable amplifying circuit illustrated in FIG. 8(b).

With reference to FIG. 10, a noise indication in the gain-variable amplifying circuit illustrated in FIG. 8(a) is lower by about 0.2 dB than the same in the gain-variable amplifying circuit illustrated in FIG. 8(b). This is because there is caused a loss due to a signal in a field effect transistor arranged in a signal path as a switch, in the gain-variable amplifying circuit illustrated in FIG. 8(b). If the loss is compensated for by increasing a gain of the gain-variable amplifying circuit, current consumption would be increased by about 50%. In other words, the gain-variable amplifying circuit illustrated in FIG. 8(a) can reduce power consumption by 50% in comparison with the gain-variable amplifying circuit illustrated in FIG. 8(b).

With reference to FIG. 9, a gain in the low-gain operation in the gain-variable amplifying circuit illustrated in FIG. 8(a) is almost equal to the same in the gain-variable amplifying circuit illustrated in FIG. 8(b). This is because the amplifying circuits 830 and 833 are sufficiently electrically separated from the gain-variable amplifying circuit. That is, the amplifying circuit is in a high-impedance condition with respect to input/output thereof.

INDUSTRIAL APPLICABILITY

In accordance with the present invention, the control circuit makes input and/or output impedances high. Hence, it would be possible to switch electrical connection to disconnection and vice versa without arranging a switch into a signal path. Furthermore, it would be possible to accomplish a high gain in low power consumption without a loss caused by arranging a switch into a signal path.

In addition, since it is possible to cancel reduction in an impedance in a high-frequency band, caused by a parasitic capacity in an amplifying device, with an inductance device, it would be possible to accomplish a high impedance in a high-frequency band. Furthermore, since it is possible to cancel reduction in an impedance with an inductance device which resonate in parallel with a parasitic capacity at a certain frequency, it would be possible to accomplish a high impedance at the certain frequency.

The gain-variable amplifying circuit in accordance with the present invention makes input/output impedance high, when an amplifying circuit(s) constituting the gain-variable amplifying circuit is(are) not selected. Hence, it is possible to maintain a high gain, regardless of a number of amplifying circuits electrically connected in parallel with one another, ensuring that there are accomplished a high gain, a low noise indication, and low current consumption, even in a broad band in which a gain varies, or even at a narrow step by which a gain varies.

What is claim is:

1. An amplifying circuit comprising:
    an amplifier amplifying a signal received through an input terminal, and outputting the signal through an output terminal; and
    a control circuit turning at least one of an input impedance and an output impedance of said amplifier into a high impedance, wherein
    said control circuit is comprised of an inductor and a switch, said inductor and said switch are electrically connected in series to each other, and further electrically connected in an AC manner between said input or output terminal and a grounded voltage, wherein
    said switch is comprised of a field effect transistor, wherein
    said inductor has an inductance resonating in parallel with a parasitic capacity of said amplifier.

2. The amplifying circuit as set forth in claim 1, further comprising a field effect transistor electrically connected in series between said amplifier and a power source, said field effect transistor interrupting a current from flowing to said amplifying circuit from said power source when said amplifying circuit is off.

3. A gain-variable amplifying circuit comprising at least two amplifying circuits electrically connected in parallel to each other and having gains different from one another,
    said amplifying circuits each comprised of:
    an amplifier amplifying a signal received through an input terminal, and outputting the signal through an output terminal; and
    a control circuit turning at least one of an input impedance and an output impedance of said amplifier into a high impedance,
    wherein a gain is controlled by turning at least one of said input and output impedances of an amplifying circuit(s) other than a selected amplifying circuit, into a high impedance, wherein
    said control circuit is comprised of an inductor and a switch said inductor and said switch are electrically connected in series to each other, and further electrically connected in an AC manner between said input or output terminal and a rounded voltage, wherein
    said switch is comprised of a field effect transistor, wherein
    said inductor has an inductance resonating in parallel with a parasitic capacity of said amplifier.

4. The gain-variable amplifying circuit as set forth in claim 3, further comprising a field effect transistor electrically connected in series between said amplifier and a power source, said field effect transistor interrupting a current from flowing to said amplifying circuit from said power source when said amplifying circuit is off.

* * * * *

UNITED STATES PATENT AND TRADEMARK OFFICE
CERTIFICATE OF CORRECTION

| | |
|---|---|
| PATENT NO. | : 7,298,215 B2 |
| APPLICATION NO. | : 10/537470 |
| DATED | : November 20, 2007 |
| INVENTOR(S) | : Hitoshi Yano et al. |

It is certified that error appears in the above-identified patent and that said Letters Patent is hereby corrected as shown below:

Col. 1, Line 18, delete "PRIOR" insert --DESCRIPTION OF THE RELATED ART--

Col. 1, Line 48, after "selected" insert --.--

Col. 1, Line 67, delete "index" insert --figure--

Col. 2, Line 36, before the paragraph beginning with "In view of the above etc." insert the Title --SUMMARY OF THE INVENTION--

Col. 2, Line 36, at the end of paragraph titled "Description of the Related Art" insert --Japanese Patent Application Publication No. 5-206818 has suggested a semiconductor switch comprised of (a) a first hybrid circuit, (b) first and second circuits each having an input end electrically connected to a pair of input/output terminals of the first hybrid circuit, and (c) a second hybrid circuit having a pair of input/output terminals each electrically connected to an output end of the first circuit and an output end of the second circuit. The first and second circuits include bias means comprised of a field effect transistor and an inductor for applying a bias voltage to a gate electrode of the field effect transistor. The first and second circuits define a filter which allows a certain frequency to pass therethrough in a bias condition where a high impedance is defined across drain and source electrodes of the field effect transistor.
    Japanese Patent Application Publication No. 2000-332545 has suggested a low-noise amplifying circuit including an input matching circuit, a low-noise amplifier, and an output matching circuit, and a switch accomplishing electrical connection between input and output of said low-noise amplifier, and a compensation circuit electrically connected to the switch for compensating for an impedance. The switch is comprised of two switches electrically connected in series between input and output of the low-noise amplifier. The compensation circuit is arranged between a node at which the two switches are electrically connected to each other, and a grounded voltage.
    Japanese Patent Application Publication No. 2000-349574 has suggested a high-power amplifier including N high-frequency amplifiers, a bias controller for turning on or off each of the N high-frequency amplifiers, N input transmission lines arranged between input terminals of the N high-frequency amplifiers and a common input terminal, and N output transmission lines arranged between output terminals of the N high-frequency amplifiers and a common output terminal. By turning on or off the N high-frequency amplifiers, matching/mismatching is controlled between the N

UNITED STATES PATENT AND TRADEMARK OFFICE
CERTIFICATE OF CORRECTION

PATENT NO. : 7,298,215 B2
APPLICATION NO. : 10/537470
DATED : November 20, 2007
INVENTOR(S) : Hitoshi Yano et al.

It is certified that error appears in the above-identified patent and that said Letters Patent is hereby corrected as shown below:

high-frequency amplifiers and the input transmission lines to thereby control an impedance observed when viewed from the common input terminal towards the input transmission lines, and an impedance observed when viewed from common output terminal towards the output transmission lines.
 Japanese Patent Application Publication No. 5-299995 has suggested a micro-wave semiconductor switch comprised of a first semiconductor switch and a second semiconductor switch. A first circuit is comprised of the first semiconductor switch and an inductance L electrically connected in series to each other. A second circuit is comprised of a second semiconductor switch including an inductor La arranged between terminals, and a capacitor C electrically connected in series with the inductor La. The first and second circuits are electrically connected in parallel with each other. The first and second semiconductor switches are designed to operate in such a manner that if one of the first and second semiconductor switches is on, the other is also on. An inductance of the inductor La and a capacity of the capacitor C are determined such that La (C + Cs) = LC wherein Cs indicates a parasitic capacity between terminals in each of the first and second semiconductor switches. The following equation is established at an operational frequency F.
 $F = 1/(2 \pi (LC)^{1/2})$
 Japanese Patent Application Publication No. 2000-307456 has suggested a tuner including a frequency-variable filter making synchronization with a frequency of a received high-frequency signal, a frequency-variable terminator arranged upstream of the frequency-variable filter and causing a small loss in a frequency band in which the frequency-variable filter allows a signal to pass therethrough, and a certain impedance in a reflection band of the frequency-variable filter, and a frequency converter which combines a high-frequency signal having passed through the frequency-variable filter, with a local oscillation signal associated with the high-frequency signal, to thereby produce an intermediate-frequency signal.--.

Col. 2, Line 49, after "In", delete "order to accomplish the above mentioned object" insert --one aspect--

Col. 3, Line 44, before "The present invention", insert --In another aspect--

UNITED STATES PATENT AND TRADEMARK OFFICE
CERTIFICATE OF CORRECTION

PATENT NO. : 7,298,215 B2
APPLICATION NO. : 10/537470
DATED : November 20, 2007
INVENTOR(S) : Hitoshi Yano et al.

It is certified that error appears in the above-identified patent and that said Letters Patent is hereby corrected as shown below:

Col. 3, Line 54, after paragraph ending with "impedance" and before the title "BRIEF DESCRIPTION OF DRAWINGS",
insert --The advantages obtained by the aforementioned present invention will be described hereinbelow.
   In accordance with the present invention, the control circuit makes input and/or output impedances high. Hence, it would be possible to switch electrical connection to disconnection and vice versa without arranging a switch into a signal path. Furthermore, it would be possible to accomplish a high gain in low power consumption without a loss caused by arranging a switch into a signal path.
   In addition, since it is possible to cancel reduction in an impedance in a high-frequency band, caused by a parasitic capacity in an amplifying device, with an inductance device, it would be possible to accomplish a high impedance in a high-frequency band. Furthermore, since it is possible to cancel reduction in an impedance with an inductance device which resonate in parallel with a parasitic capacity at a certain frequency, it would be possible to accomplish a high impedance at the certain frequency.
   The gain-variable amplifying circuit in accordance with the present invention makes input/output impedance high, when an amplifying circuit(s) constituting the gain-variable amplifying circuit is(are) not selected. Hence, it is possible to maintain a high gain, regardless of a number of amplifying circuits electrically connected in parallel with one another, ensuring that there are accomplished a high gain, a low noise figure, and low current consumption, even in a broad band in which a gain varies, or even at a narrow step by which a gain varies.
   The above and other objects and advantageous features of the present invention will be made apparent from the following description made with reference to the accompanying drawings, in which like reference characters designate the same or similar parts throughout the drawings.--

Col. 4, Line 10, Line 14, Line 18, Line 21 delete "a" and "b" insert --A-- and --B--

Col. 4, Line 31, through Col. 5 Line 3 delete entire paragraph titled "Indication by Reference Numerals"

Col. 5, Line 5, delete "DETAILED"

Col. 7, Lines 1, 5, 8, 10, 14, 17, 18 delete "a" and "b" and insert --A-- and --B--

Col. 11, Lines 52, 54, 57 delete "a" and "b" insert --A-- and --B--

UNITED STATES PATENT AND TRADEMARK OFFICE
CERTIFICATE OF CORRECTION

PATENT NO. : 7,298,215 B2
APPLICATION NO. : 10/537470
DATED : November 20, 2007
INVENTOR(S) : Hitoshi Yano et al.

It is certified that error appears in the above-identified patent and that said Letters Patent is hereby corrected as shown below:

Col. 12, Lines 9, 10, 21, 27, 36, 38, 40, 44, 45, 47, 49, 52, 56, 58, 61, 62, and 63 delete "a" and "b" insert --A-- and --B--

Col. 13, Line 1, insert paragraph beginning with
   --While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.
   The entire disclosure of Japanese Patent Application No. 2002-352664 filed on December 4, 2002 including specification, claims, drawings and summary is incorporated herein by reference in its entirety.--

Col. 13, Lines 1-29, delete paragraph titled "INDUSTRIAL APPLICABILITY"

Signed and Sealed this

Twenty-third Day of September, 2008

JON W. DUDAS
*Director of the United States Patent and Trademark Office*